(12) United States Patent
Igarashi et al.

(10) Patent No.: US 7,714,232 B2
(45) Date of Patent: May 11, 2010

(54) CIRCUIT DEVICE AND METHOD OF MANUFACTURING THE SAME

(75) Inventors: Yusuke Igarashi, Gunma (JP); Sadamichi Takakusaki, Gunma (JP); Motoichi Nezu, Gunma (JP); Takaya Kusabe, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 364 days.

(21) Appl. No.: 10/588,467

(22) PCT Filed: Feb. 18, 2005

(86) PCT No.: PCT/JP2005/003096

§ 371 (c)(1),
(2), (4) Date: Oct. 3, 2007

(87) PCT Pub. No.: WO2005/081311

PCT Pub. Date: Sep. 1, 2005

(65) Prior Publication Data

US 2008/0106875 A1 May 8, 2008

(30) Foreign Application Priority Data

Feb. 24, 2004 (JP) .............................. 2004-048259

(51) Int. Cl.
*H05K 1/16* (2006.01)
(52) U.S. Cl. ...................... 174/260; 174/255
(58) Field of Classification Search ................ 174/255, 174/260, 262
See application file for complete search history.

(56) References Cited

U.S. PATENT DOCUMENTS

| 5,384,683 | A | * | 1/1995 | Tsunoda ..................... 361/313 |
| 6,222,136 | B1 | * | 4/2001 | Appelt et al. ............... 174/254 |
| 6,718,631 | B2 | * | 4/2004 | Takeuchi ..................... 29/852 |
| 2002/0011348 | A1 | | 1/2002 | Takeuchi |
| 2003/0141596 | A1 | * | 7/2003 | Nakamura et al. .......... 257/758 |

FOREIGN PATENT DOCUMENTS

| CN | 1359256 A | 7/2002 |
| JP | 01-266786 | 10/1989 |
| JP | 03-058492 | 3/1991 |
| JP | 04-096258 | 3/1992 |
| JP | 06-177295 | 6/1994 |
| JP | 06-334311 | 12/1994 |
| JP | 09-130018 | 5/1997 |
| JP | 2001-196738 | 7/2001 |
| WO | WO 03/069966 | 8/2003 |

* cited by examiner

*Primary Examiner*—Ishwarbhai B Patel
(74) *Attorney, Agent, or Firm*—Fish & Richardson P.C.

(57) ABSTRACT

Provided are a hybrid integrated circuit device in which fine patterns can be formed while current-carrying capacitances are ensured, and a method of manufacturing the same. The hybrid integrated circuit device of the present invention includes conductive patterns formed on a front surface of a circuit substrate and circuit elements electrically connected respectively to the conductive patterns. The conductive patterns include a first conductive pattern and a second conductive pattern formed more thickly than the first conductive pattern. The second conductive pattern includes a protruding portion protruding in a thickness direction thereof.

4 Claims, 10 Drawing Sheets

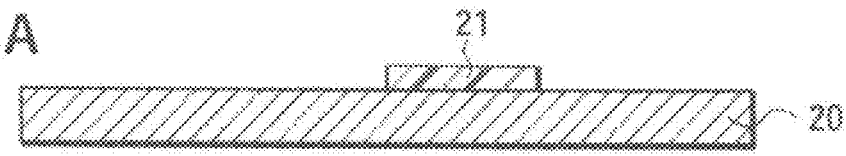
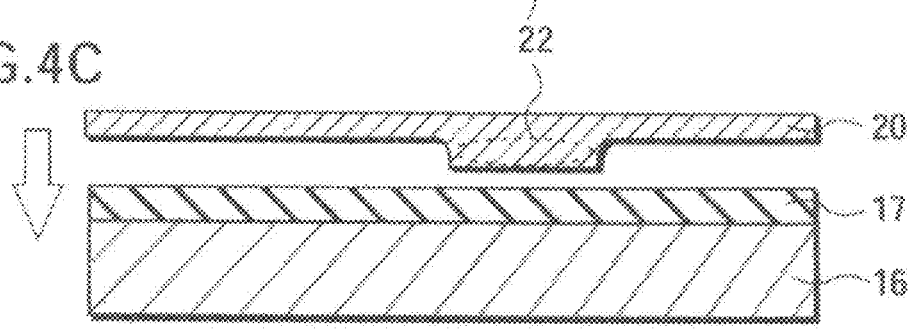
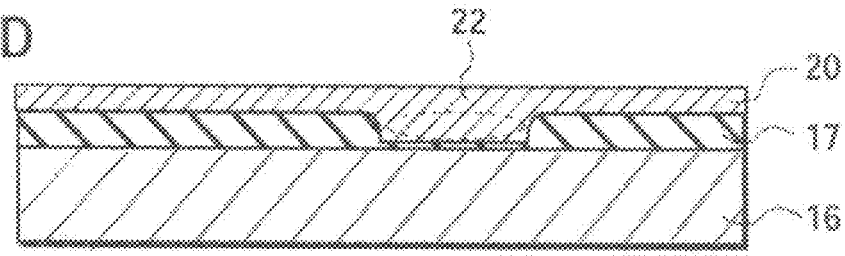
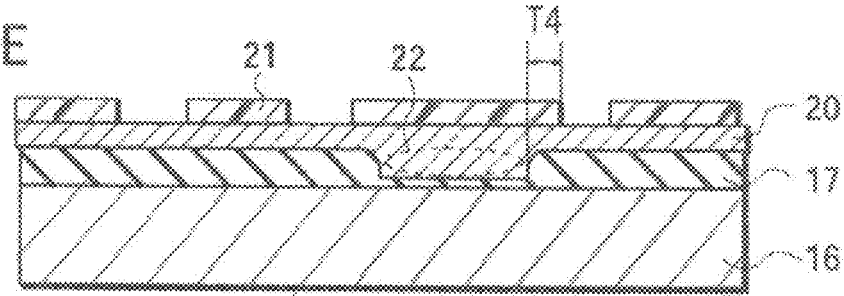
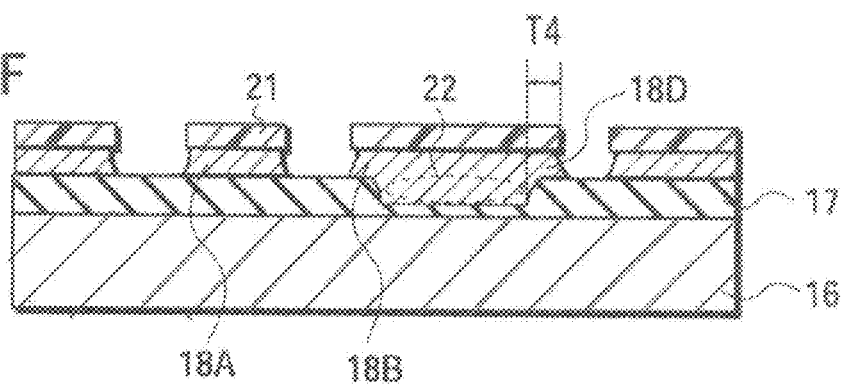

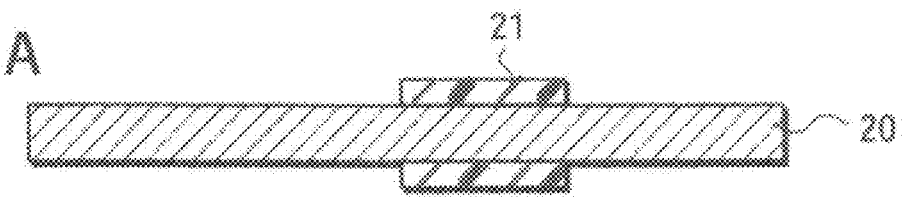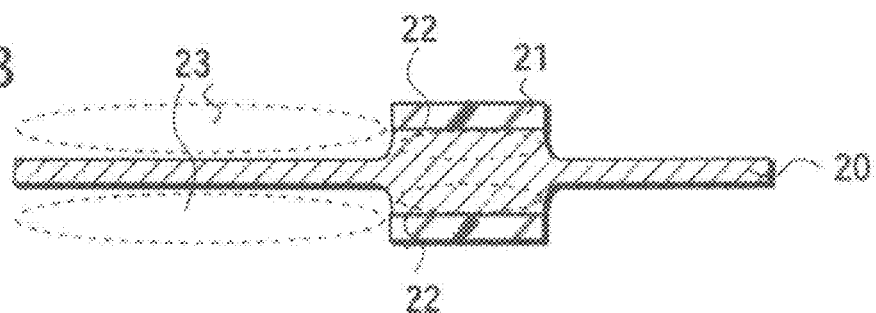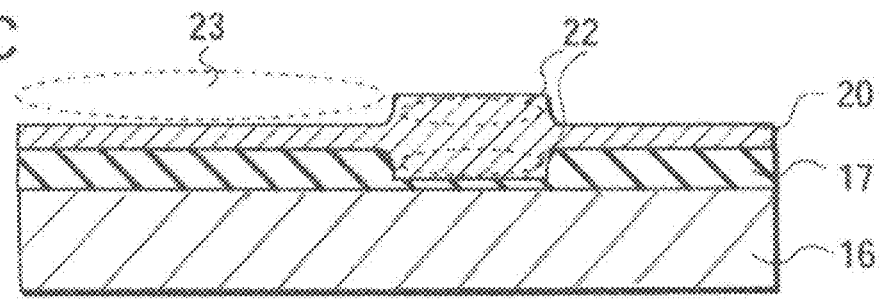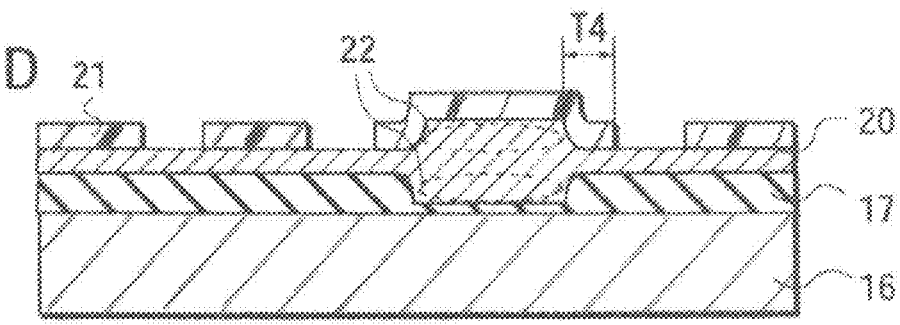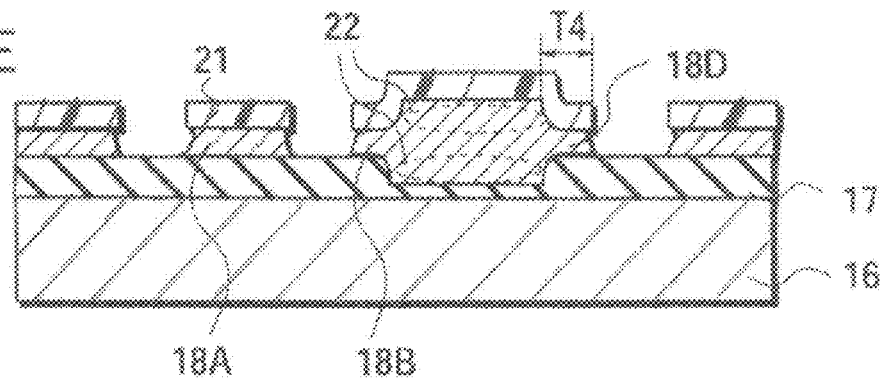

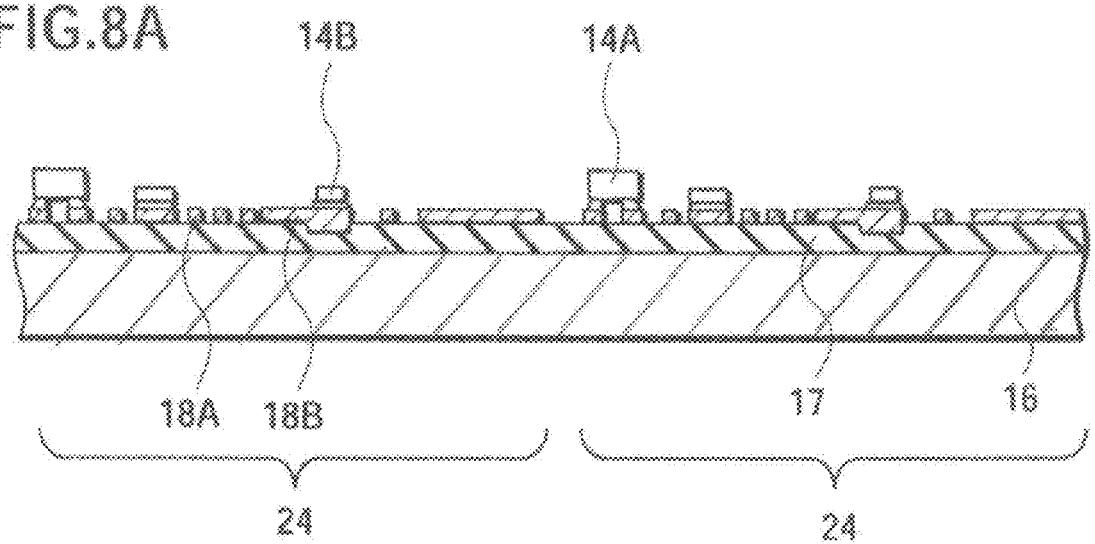
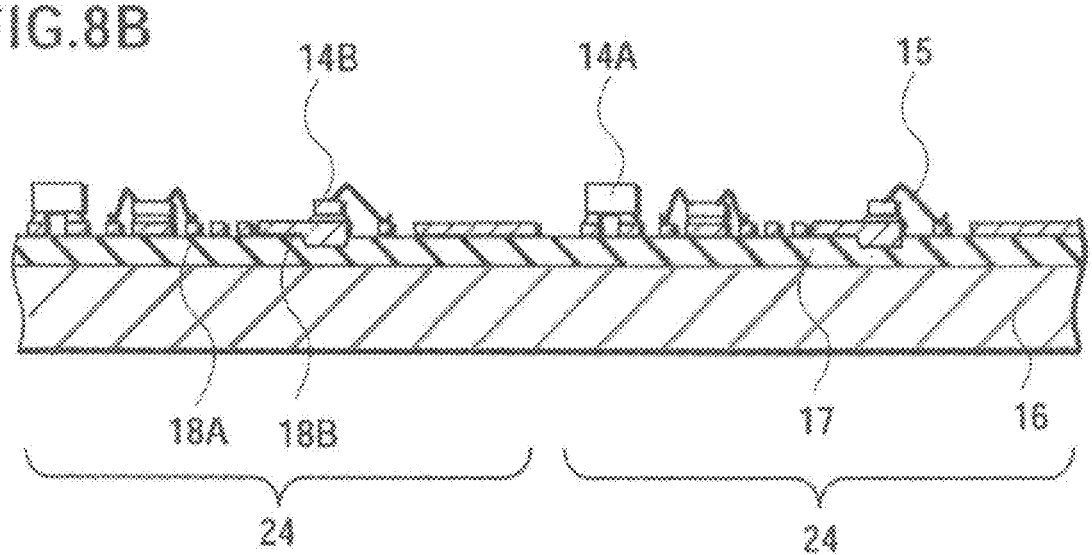

CIRCUIT DEVICE AND METHOD OF MANUFACTURING THE SAME

BACKGROUND OF THE INVENTION

Priority is claimed to Japanese Patent Application Number JP2004-48259 filed on Feb. 24, 2004, the disclosure of which is incorporated herein by reference in its entirety.

1. Field of the Invention

The present invention relates to a circuit device and a method of manufacturing the same. In particular, the present invention relates to a circuit device which has conductive patterns having different thicknesses, and a method of manufacturing the same.

2. Description of the Related Art

Referring to FIGS. 10A and 10B, a constitution of a conventional hybrid integrated circuit device will be described (for example, refer to Japanese Patent Application Official Gazette No. Hei 6 (1994)-177295 (page 4, FIG. 1)). FIG. 10A is a perspective view of a hybrid integrated circuit device 100, and FIG. 10B is a cross-sectional view taken along a line x-x' of FIG. 10A.

The conventional hybrid integrated circuit device 100 has the following constitution. The hybrid integrated circuit device 100 is constituted of a rectangular substrate 106, an insulating layer 107 provided on a surface of the substrate 106, conductive patterns 108 formed on the insulating layer 107, circuit elements 104 fixed on the conductive patterns 108, thin metal wires 105 for electrically connecting the circuit elements 104 and the conductive patterns 108, and leads 101 electrically connected to the conductive patterns 108. The entire hybrid integrated circuit device 100 is sealed with a sealing resin 102. Methods of sealing the entire hybrid integrated circuit device 100 with the sealing resin 102 include injection molding using thermoplastic resin and transfer molding using thermosetting resin.

However, in the hybrid integrated circuit device as described above, film thicknesses of the conductive patterns differ between a hybrid integrated circuit substrate (hereinafter referred to as a substrate) on which a power element for a large current is mounted and a substrate on which a small-signal element is mounted. For example, in the substrate on which the power element is mounted, the thickness of the conductive pattern is, for example, 100 μm. Meanwhile, in the substrate on which the small-signal element is mounted, the thickness of the conductive pattern is 35 μm. Accordingly, there has been a problem that a cost is increased by preparing substrates having different thicknesses depending on elements to be mounted.

Moreover, in a substrate including a thick conductive pattern having a thickness of approximately 100 μm, there has been another problem that an LSI (large scale integration) circuit having a large number of terminals cannot be mounted on a mounting board because a fine pattern cannot be formed by use of the thick conductive pattern. Furthermore, there has been another problem that when a power element is mounted on a substrate including a thin conductive pattern having a thickness of approximately 35 μm, a sufficient current-carrying capacitance cannot be ensured since the thin conductive pattern has a small cross-sectional area.

The present invention has been made in view of the above-described problems. A main object of the present invention is to provide a circuit device in which a fine pattern can be formed while a current-carrying capacitance is ensured, and a method of manufacturing the same.

SUMMARY OF THE INVENTION

A circuit device of the present invention includes: conductive patterns formed on a surface of a circuit substrate; and circuit elements electrically connected to the conductive patterns. The conductive patterns include a first conductive pattern and a second conductive pattern formed more thickly than the first conductive pattern. Front surfaces of the first and second conductive patterns are placed at substantially equal levels, and a protruding portion is provided on a back surface of the second conductive pattern. The protruding portion protrudes, in a thickness direction, from the back surface of the first conductive pattern.

A circuit device of the present invention includes: conductive patterns formed on a surface of a circuit substrate; and circuit elements electrically connected respectively to the conductive patterns. The conductive patterns include a first conductive pattern and a second conductive pattern formed more thickly than the first conductive pattern. Back surfaces of the first and second conductive patterns are placed at substantially equal levels, and a protruding portion is provided on a front surface of the second conductive pattern. The protruding portion protrudes, in the thickness direction, from the front surface of the first conductive pattern.

A circuit device of the present invention includes: conductive patterns formed on a surface of a circuit substrate; and circuit elements electrically connected respectively to the conductive patterns. The conductive patterns include a first conductive pattern and a second conductive pattern formed more thickly than the first conductive pattern. Protruding portions protruding in a thickness direction are provided on a front surface and a back surface of the second conductive pattern.

Moreover, in the circuit device of the present invention, an edge portion having a thickness substantially equal to that of the first conductive pattern is formed around the protruding portion.

Additionally, in the circuit device of the present invention, a width of the edge portion is larger than the thickness of the first conductive pattern.

Furthermore, in the circuit device of the present invention, the protruding portion is buried in an insulating layer formed on the surface of the circuit substrate.

In addition, in the circuit device of the present invention, the circuit substrate is any one of a metal substrate, a ceramic substrate, a printed board, and a flexible sheet.

Also, in the circuit device of the present invention, a first circuit element is connected to the first conductive pattern, and a second circuit element having a current-carrying capacitance larger than the first circuit element is connected to the second conductive pattern.

A circuit device manufacturing method of the present invention includes the steps of: preparing a conductive foil provided with a protruding portion on a surface thereof, the protruding portion protruding in a thickness direction; bringing the conductive foil into intimate contact with a circuit substrate so as to bury the protruding portion in an insulating layer provided on a surface of the circuit substrate; and forming a first conductive pattern and a second conductive pattern, which includes the protruding portion and which is thicker than the first conductive pattern, by partially removing the conductive foil in a region where the protruding portion is not provided.

Furthermore, a circuit device manufacturing method of the present invention includes the steps of: preparing a conductive foil provided with a protruding portion provided on a front surface thereof, the protruding portion protruding in a thickness direction; bringing a back surface of the conductive foil into intimate contact with an insulating layer provided on a surface of a circuit substrate; and forming a first conductive pattern and a second conductive pattern, which includes the protruding portion and which is thicker than the first conductive pattern, by partially removing the conductive foil in a region where the protruding portion is not provided.

Moreover, a circuit device manufacturing method of the present invention includes the steps of: preparing a conductive foil provided with protruding portions on a front surface and a back surface thereof, the protruding portions protruding in a thickness direction; bringing the conductive foil into intimate contact with a circuit substrate to bury one of the protruding portions into an insulating layer provided on a surface of the circuit substrate; and forming a first conductive pattern and a second conductive pattern, which includes the protruding portions and which is thicker than the first conductive pattern, by partially removing the conductive foil in a region where the protruding portions are not provided.

Also, in the circuit device manufacturing method of the present invention, side surfaces of the protruding portion are curved surfaces.

Furthermore, in the circuit device manufacturing method of the present invention, the conductive foil is patterned so that an edge portion having a thickness equal to that of the first conductive pattern can remain around the protruding portion.

Moreover, in the circuit device manufacturing method of the present invention, a width of the edge portion is made larger than the thickness of the first conductive pattern.

In addition, in the circuit device manufacturing method of the present invention, the first and second conductive patterns are formed by etching processing.

BRIEF DESCRIPTION OF THE DRAWINGS

FIG. 4A is a cross-sectional view for explaining a hybrid integrated circuit device manufacturing method of the embodiment of the present invention.

FIG. 4B is a cross-sectional view for explaining the hybrid integrated circuit device manufacturing method of the embodiment of the present invention.

FIG. 4C is a cross-sectional view for explaining the hybrid integrated circuit device manufacturing method of the embodiment of the present invention.

FIG. 4D is a cross-sectional view for explaining the hybrid integrated circuit device manufacturing method of the embodiment of the present invention.

FIG. 4E is a cross-sectional view for explaining the hybrid integrated circuit device manufacturing method of the embodiment of the present invention.

FIG. 4F is a cross-sectional view for explaining the hybrid integrated circuit device manufacturing method of the embodiment of the present invention.

FIG. 7A is a cross-sectional view for explaining a hybrid integrated circuit device manufacturing method of the embodiment of the present invention.

FIG. 7B is a cross-sectional view for explaining the hybrid integrated circuit device manufacturing method of the embodiment of the present invention.

FIG. 7C is a cross-sectional view for explaining the hybrid integrated circuit device manufacturing method of the embodiment of the present invention.

FIG. 7D is a cross-sectional view for explaining the hybrid integrated circuit device manufacturing method of the embodiment of the present invention.

FIG. 7E is a cross-sectional view for explaining the hybrid integrated circuit device manufacturing method of the embodiment of the present invention.

FIG. 8A is a cross-sectional view for explaining a hybrid integrated circuit device manufacturing method of the embodiment of the present invention.

FIG. 8B is a cross-sectional view for explaining the hybrid integrated circuit device manufacturing method of the embodiment of the present invention.

DESCRIPTION OF THE PREFERRED EMBODIMENTS

Figure 1A:
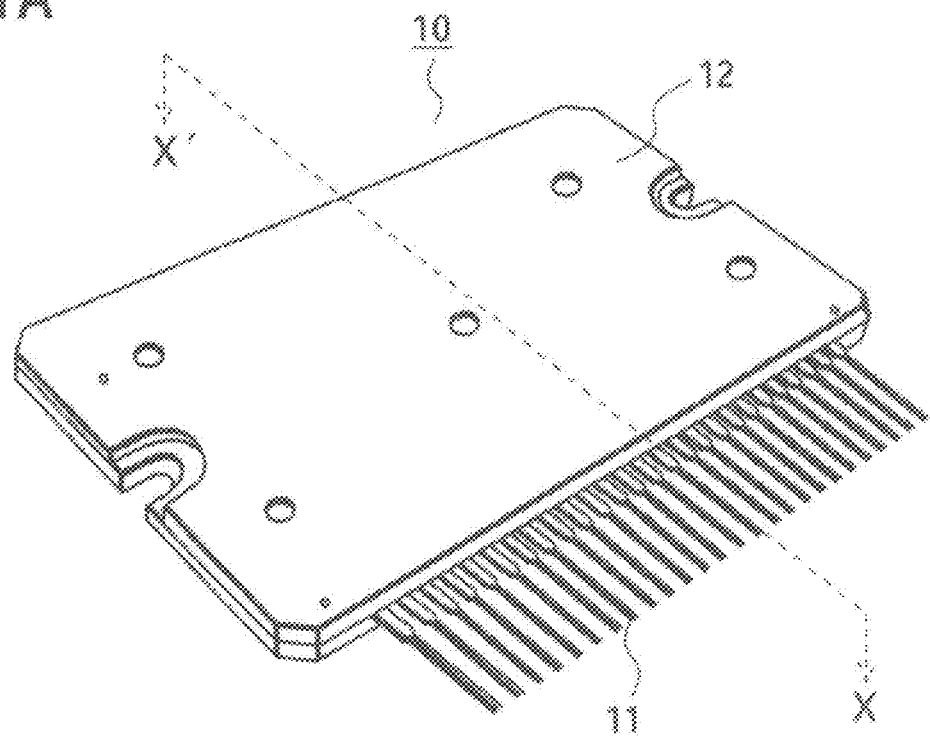
FIG. 1A is a perspective view of a hybrid integrated circuit device of an embodiment of the present invention.

A constitution of a hybrid integrated circuit device 10 of an embodiment of the present invention will be described with reference to FIGS. 1A and 1B. FIG. 1A is a perspective view of the hybrid integrated circuit device 10, and FIG. 1B is a cross-sectional view taken along a line X-X' of FIG. 1A.

The hybrid integrated circuit device 10 of the embodiment of the present invention includes conductive patterns 18 formed on a surface of a circuit substrate 16 and circuit elements 14 electrically connected respectively to the conductive patterns 18. The conductive patterns 18 include a first conductive pattern 18A and a second conductive pattern 18B which is formed more thickly than the first conductive pattern 18A. The conductive patterns 18 have a constitution in which the second conductive pattern 18B has a larger current-carrying capacitance than the first conductive pattern 18A. Each of the components will be described below.

The circuit substrate 16 is preferably a substrate made of metal, ceramic or the like from the viewpoint of heat dissipation. However, a printed board made of a flexible sheet, resin or the like may be used, and a substrate at least having the insulated surface can be used. As a material for the circuit substrate 16, a metal such as Al, Cu or Fe can be employed, or a ceramic such as $Al_2O_3$ or AlN can be employed. Other than these, a material excellent in mechanical strength and heat dissipation can be employed as a material for the circuit substrate 16. As one example, in a case where a substrate made of Al is employed for the circuit substrate 16, the surface of the circuit substrate 16 is covered with an insulating layer 17. In addition, the conductive patterns 18 are formed on a surface of the insulating layer 17. That is, the circuit substrate 16 and the conductive patterns 18 are insulated from each other with the insulating layer 17 interposed therebetween. Moreover, the surface of the circuit substrate 16 made of Al is anodized.

Figure 1B:
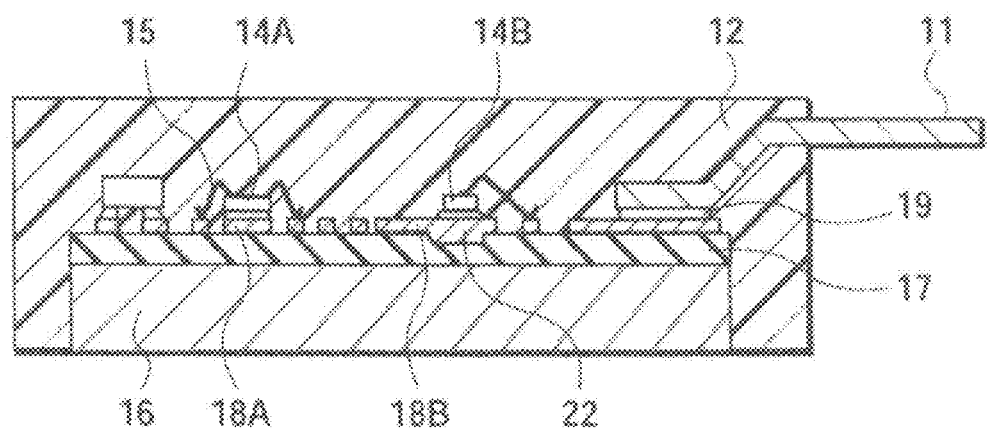
FIG. 1B is a cross-sectional view of the hybrid integrated circuit device of the embodiment of the present invention.

Referring to FIG. 1B, a back surface of the circuit substrate 16 is exposed outside a sealing resin 12 in order to suitably release heat generated in the circuit elements 14 mounted on the surface of the circuit substrate 16 to an outside. Alternatively, for improving moisture resistance of the entire device, it is also possible to seal the entire circuit substrate 16 including the back surface thereof with the sealing resin 12. Moreover, the surface of the circuit substrate 16 may be sealed with case material.

The circuit elements 14 are fixed respectively on the conductive patterns 18, and the circuit elements 14 and the conductive patterns 18 constitute a predetermined electric circuit. As the circuit elements 14, active elements such as transistors and diodes as well as passive elements such as capacitors and resistors are employed. Power semiconductor elements and the like which generate a large amount of heat may be fixed to the circuit substrate 16 with a heat sink made of metal interposed therebetween. Moreover, it is also possible to mount a resin-sealed circuit device on the conductive pattern 18. Here, an active element and the like mounted face up are electrically connected respectively to the conductive patterns 18 through thin metal wires 15.

In this embodiment, the circuit elements 14 include a first circuit element 14A through which a relatively small current flows and a second circuit element 14B through which a large current flows.

Specifically, examples of the first circuit element 14A include an LSI chip, a capacitor, a resistor and the like. An LSI chip whose back surface is electrically connected to a ground potential or the like is connected to the conductive pattern 18 by means of brazing material or conductive paste. Meanwhile, an LSI chip, whose back surface is not electrically connected, is connected to the conductive pattern 18 by means of an insulating adhesive. The first circuit element 14A having a small current-carrying capacitance is fixed to the first conductive pattern 1 8A formed as thin as, for example, approximately several tens of micrometers.

The second circuit element 14B is connected to the second conductive pattern 18B formed as thick as, for example, approximately several hundreds of micrometers. A power transistor, such as a power MOS (Metal-Oxide Semiconductor), an IGBT (Insulated Gate Bipolar Transistor), or a thyristor, for controlling a large current can be employed as the second circuit element 14B. In addition, a power IC is also appropriate. As for these second circuit elements 14B, since chips are small in size and in thickness and are highly functional, a large amount of heat is generated.

The conductive patterns 18 are made of metal such as copper and formed so as to be insulated from the substrate 16. Moreover, pads composing of the conductive patterns 18 are formed along a side from which leads 11 extend. Although the description is given of a case where the leads extend from one side, it is sufficient that the leads extend from at least one side. Moreover, the conductive patterns 18 are bonded to the surface of the circuit substrate 16 by using the insulating layer 17 as an adhesive. The conductive patterns 18 include the first conductive pattern 18A and the second conductive pattern 18B formed more thickly than the first conductive pattern 18A. Additionally, the first conductive pattern 18A follows a narrower pattern rule than the second conductive pattern 18B.

The first conductive pattern 18A is a pattern formed as thin as approximately several tens of micrometers in thickness. A thickness of the first conductive pattern 18A is selected from the range of, for example, approximately 9 μm to 80 μm. The thickness of the first conductive pattern 18A which is suitable for a mass production level is, for example, approximately 30 μm. This thickness makes it possible to reduce a distance between patterns up to approximately 50 μm by wet etching. Here, the distance between the patterns means a distance between inner edge portions respectively of each two adjacent patterns. Moreover, with this thickness, since widths of the patterns can also be reduced up to approximately 50 μm, it becomes possible to form fine patterns. Specifically, the first conductive pattern 18A is used as a pattern for a passage of an electric signal of, for example, approximately several milliamperes. For example, a signal for controlling an LSI element passes through the first conductive pattern 18A.

The second conductive pattern 18B is a pattern formed more thickly than the first conductive pattern 18A. A thickness of the second conductive pattern 18B can be selected from the range of approximately 35 μm to 500 μm depending on a required current-carrying capacitance. In a case where the thickness of the second conductive pattern 18B is set at approximately 100 μm, a distance between patterns and widths thereof can be set at approximately 300 μm. With this second conductive pattern 18B, it becomes possible to allow a current of approximately 50 amperes to flow.

The insulating layer 17 is formed over the entire surface of the circuit substrate 16 and functions for bonding the back surface of the conductive patterns 18 to the surface of the circuit substrate 16. Furthermore, the insulating layer 17 is made of an inorganic filler, such as alumina, which is highly filled into resin, and thereby has an excellent thermal conductivity. A distance between a lower end of the conductive patterns 18 and the surface of the circuit substrate 16 (a minimum thickness of the insulating layer 17) changes depending on a breakdown voltage, and is preferably not less than approximately 50 µm.

The leads 11 are fixed to the pads provided in a peripheral portion of the circuit substrate 16, and, for example, functions for performing an input from and an output to the outside. Here, a large number of the leads 11 are provided along one side. The leads 11 and the pads are bonded with a conductive adhesive such as a solder (brazing material).

The sealing resin 12 is formed by transfer molding using thermosetting resin or injection molding using thermoplastic resin. Here, the sealing resin 12 is formed so as to seal the circuit substrate 16 and the electric circuits formed on the surface of the circuit substrate 16, and the back surface of the circuit substrate 16 is exposed from the sealing resin 12. Furthermore, a sealing method other than a sealing by molding is also applicable to the hybrid integrated circuit device of this embodiment. Other sealing methods such as sealing by potting resin or sealing by using case material can be applied thereto.

Figure 2:
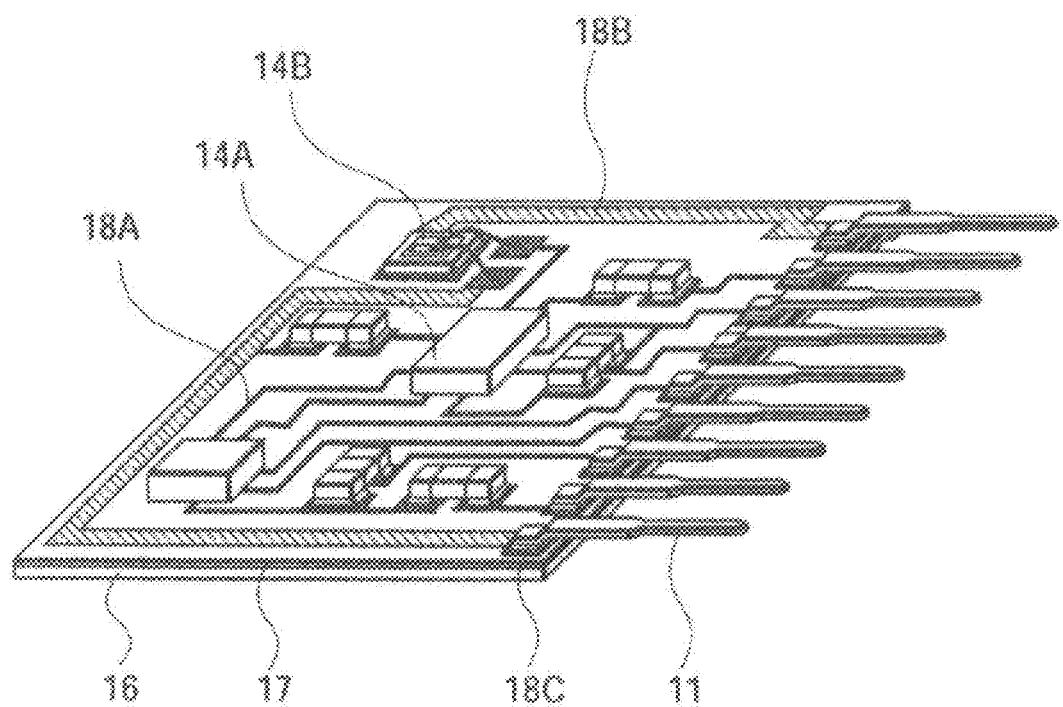
FIG. 2 is a perspective view of the hybrid integrated circuit device of the embodiment of the present invention.

Referring to the perspective view of FIG. 2, examples of specific shapes of the conductive patterns 18 formed on the surface of the circuit substrate 16 will be described. In this, the resin for sealing the entire device is omitted.

As described previously, in this embodiment, the conductive patterns 18 can be classified into the first conductive pattern 18A thinly formed and the second conductive pattern 18B thickly formed. In FIG. 2, the first conductive pattern 18A is shown by using solid lines, and the second conductive pattern 18B is shown by using a hatched pattern. The first conductive pattern 18A can be applied so as to design a pattern through which a small signal passes, and the second conductive pattern 18B can be applied so as to design a pattern through which a large signal passes. Here, examples of the large signals include a signal for driving a speaker or a motor. On the other hand, examples of the small signals include a signal inputted to or outputted from the first circuit element 14A which is an LSI element, and an electric signal inputted to a control terminal of the second circuit element 14B which is a switching element.

Here, a pattern connected to the first circuit element which is an LSI element is constituted of the first conductive pattern 18A. Since an electric signal used in a signal processing of an LSI element is approximately several milliamperes, the current-carrying capacitance of the first conductive pattern 18A having a thickness of approximately several tens of micrometers is sufficient. In addition, since the first conductive pattern 18A is finely formed, an LSI element having a large number of terminals can also be employed as the first circuit element 14A.

The second conductive pattern 18B is connected to an input-output electrode of the second circuit element 14B which is a power transistor or the like. That is, a switching of a large current flowing through the second conductive pattern 18B is performed based on a small signal inputted through the first conductive pattern 18A.

Figure 3A:
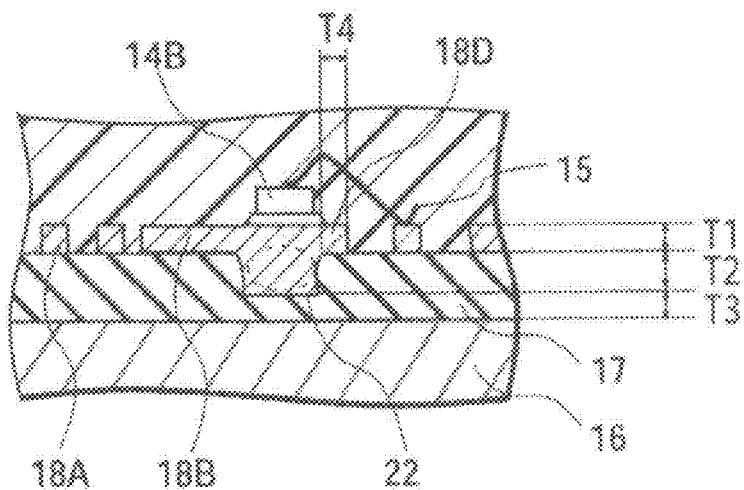
FIG. 3A is a cross-sectional view of a hybrid integrated circuit device of the embodiment of the present invention.
Figure 3B:
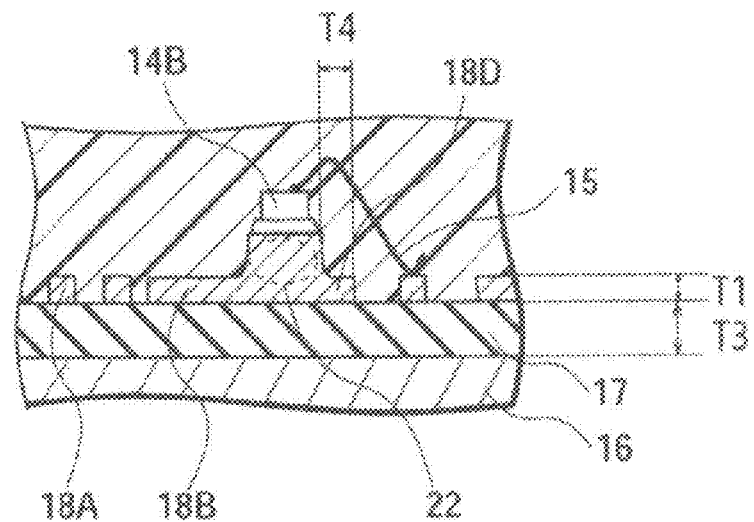
FIG. 3B is a cross-sectional view of a hybrid integrated circuit device of the embodiment of the present invention.
Figure 3C:
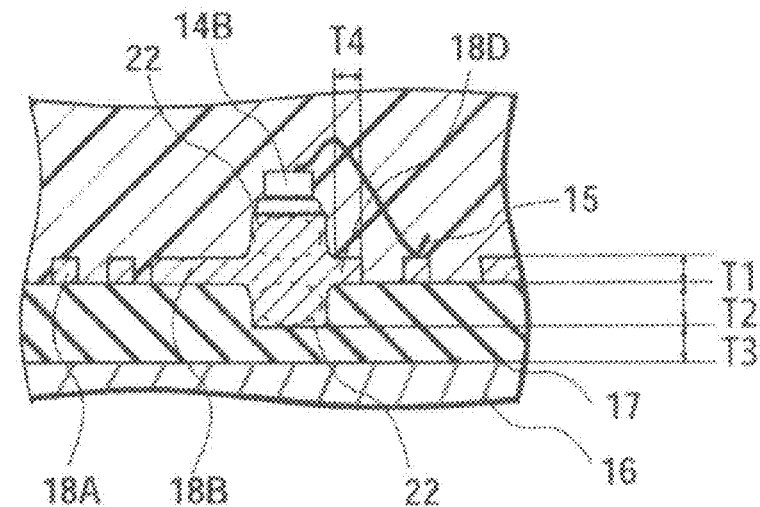
FIG. 3C is a cross-sectional view of a hybrid integrated circuit device of the embodiment of the present invention.

Referring to FIGS. 3A to 3C, details of the second conductive patterns 18B will be described. FIGS. 3A to 3C show shapes of the second conductive patterns 18B.

Referring to FIG. 3A, here, the thick second conductive pattern 18B is formed by partially providing a protruding portion 22. The protruding portion 22 is provided on a back surface of the second conductive pattern 18B, integrally protrudes in the thickness direction, and is buried in the insulating layer 17. Upper surfaces of the first conductive pattern 18A and the second conductive pattern 18B are substantially on the same level.

Here, the thickness of the first conductive pattern 18A is denoted as T1, a depth at which the protruding portion 22 of the second conductive pattern 18B is buried in the insulating layer 17 is denoted as T2, and a distance between the lowest portion of the second conductive pattern 18B and the surface of the circuit substrate 16 is denoted as T3. T1 is preferably in a range of approximately 9 µm to 80 µm in order to finely form the first conductive pattern 18A. T2 is preferably in a range of approximately 35 µm to 500 µm in order to ensure the current-carrying capacitance of the second conductive pattern 18B. That is, the thickness of the second conductive pattern 18B increases by T2 in comparison with that of the first conductive pattern 18A. T3 is preferably in a range of approximately 50 µm to 200 µm in consideration of a breakdown voltage.

Advantages provided by burying a part of the second conductive pattern 18B in the insulating layer 17 will be described. First, since the lowest surface of the second conductive pattern 18B becomes close to the surface of the circuit substrate 16, a heat generated in the second circuit element 14B can be released to the outside through the second conductive pattern 18B and the insulating layer 17. In this embodiment, the insulating layer 17 highly filled with the filler is used. Moreover, in order to improve heat dissipation, it is better to make the insulating layer 17 as thin as a breakdown voltage can be ensured. Accordingly, by employing a constitution in which the second conductive pattern 18B is partially buried in the insulating layer 17, the distance between the second conductive pattern 18B and the circuit substrate 16 can be shorten. This contributes to improvement of the heat dissipation of the entire device.

Moreover, by employing the constitution in which the second conductive pattern 18B is buried in the insulating layer 17, a contact area between the back surface of the second conductive pattern 18B and the insulating layer 17 can be enlarged. Accordingly, the heat dissipation can be further improved. Comparing the protruding portion 22 to a cube, all the surfaces except the upper surface are substantially in contact with the insulating layer 17. Thus, since the heat dissipation can be improved, it is also possible to realize a constitution in which a heat sink is omitted. Furthermore, burying the part of the second conductive pattern 18B in the insulating layer 17 makes it possible to improve an adhesion therebetween. Accordingly, peel strength of the second conductive pattern 18B can be improved.

Since the first conductive pattern 18A is not buried in the insulating layer 17, a long distance can be ensured between the back surface of the first conductive pattern 18A and the circuit substrate 16. This makes it possible to reduce a parasitic capacitance generated between the first conductive pattern 18A and the circuit substrate 16. Accordingly, even in a case where a high-frequency electric signal is passed through the first conductive pattern 18A, a delay and the like of the signal due to the parasitic capacitance is prevented.

An edge portion 18D is a portion formed in a peripheral portion of the second conductive pattern 18B, and a thickness thereof is equivalent to that of the first conductive pattern 18A. The edge portion 18D is a portion provided since the conductive patterns 18 are manufactured by etching. Specifically, when the conductive patterns 18 are patterned by etching, a margin is provided around the protruding portion 22 in order to prevent the protruding portion 22 from being etched. A portion corresponding to this margin becomes the edge portion 18D and lies around the protruding portion 22. The width T4 of the edge portion 18D is preferably not less than the thickness of the first conductive pattern 18A. As one example, the width T4 is preferably not less than approximately 100 µm. This is because the etching for patterning the conductive patterns 18 proceeds isotropically. In order to prevent the isotropically proceeding etching from reaching the protruding portion 22, it is preferable to make the width T4 of the edge portion 18D larger than the thickness of the first conductive pattern 18A.

Referring to FIG. 3B, another constitution will be described in which the second conductive pattern 18B is thickly formed. Here, the second conductive pattern 18B is formed, having the protruding portion 22 of which a thick portion protrudes upward. Accordingly, a cross-sectional area of the second conductive pattern 18B becomes large, and a large current-carrying capacitance can be ensured. In addition, since the thickness increases, a transient thermal resistance can be made small. Furthermore, the bottom surfaces of the first conductive pattern 18A and the second conductive pattern 18B are on the same level.

Referring to FIG. 3C, here, thick portions of the second conductive pattern 18B protrude both upward and downward so as to thickly form the second conductive pattern 18B. That is, the protruding portions 22 are formed on both a front surface and the back surface of the second conductive pattern 18B. Accordingly, it becomes possible to make the thickness of the second conductive pattern 18B further larger. Thereby, the current-carrying capacitance can be ensured and an effect of reducing the transient thermal resistance can be made larger. Moreover, since the second conductive pattern 18B is formed by etching a plurality of times, the pattern can be made thick while the width T4 of the edge portion 18D is made small.

Figure 5A:
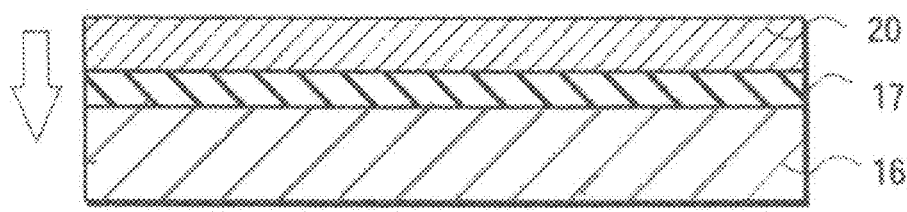
FIG. 5A is a cross-sectional view for explaining a hybrid integrated circuit device manufacturing method of the embodiment of the present invention.
Figure 5B:
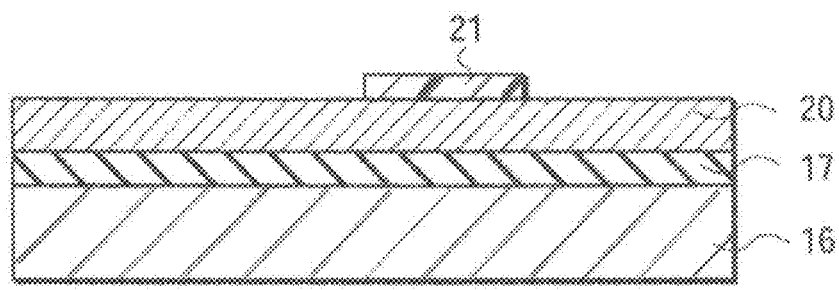
FIG. 5B is a cross-sectional view for explaining the hybrid integrated circuit device manufacturing method of the embodiment of the present invention.
Figure 5C:
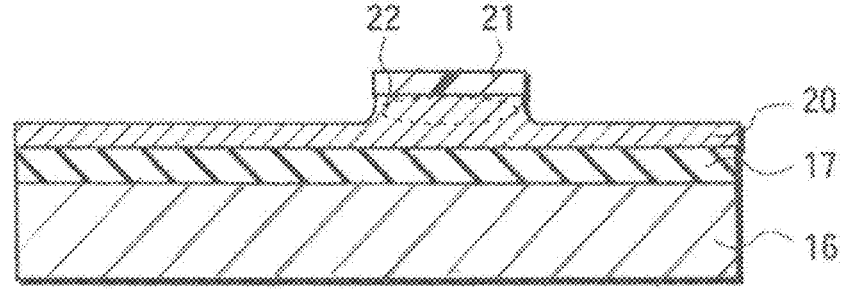
FIG. 5C is a cross-sectional view for explaining the hybrid integrated circuit device manufacturing method of the embodiment of the present invention.
Figure 6A:
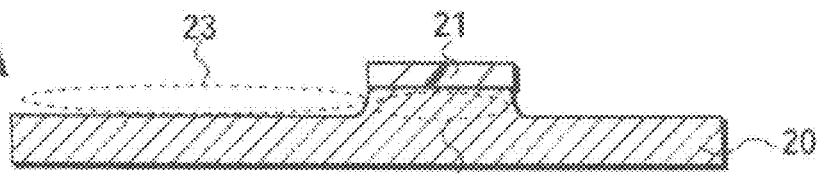
FIG. 6A is a cross-sectional view for explaining a hybrid integrated circuit device manufacturing method of the embodiment of the present invention.
Figure 6B:
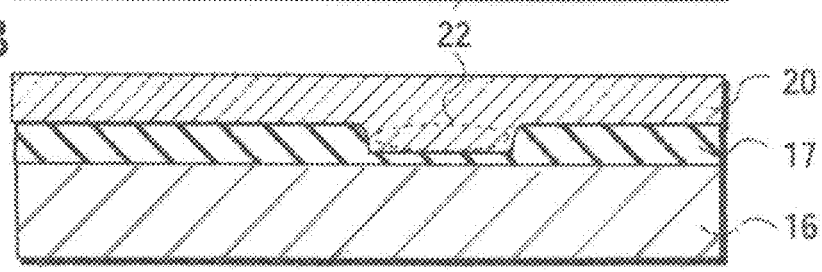
FIG. 6B is a cross-sectional view for explaining the hybrid integrated circuit device manufacturing method of the embodiment of the present invention.
Figure 6C:
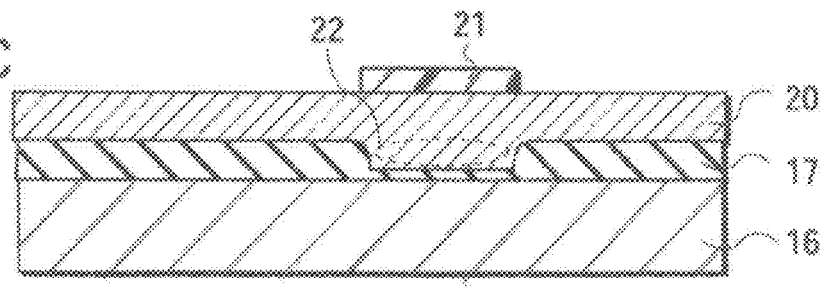
FIG. 6C is a cross-sectional view for explaining the hybrid integrated circuit device manufacturing method of the embodiment of the present invention.
Figure 6D:
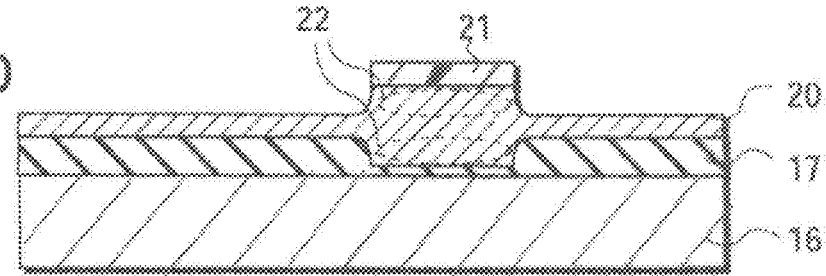
FIG. 6D is a cross-sectional view for explaining the hybrid integrated circuit device manufacturing method of the embodiment of the present invention.

In cases where a thin pattern and a thick pattern are united with each other as one as shown in FIGS. 4D, 5C, and 6D, there is an advantage that both of the thin and thick patterns can be pattern at one time, by patterning the thin pattern to form the thick pattern.

Next, referring to FIGS. 4A to 4F, a method of manufacturing the above-described hybrid integrated circuit device will be described.

First, a method of manufacturing conductive patterns 18 having the cross-sectional shape shown in FIG. 3A will be described with reference to FIGS. 4A to 4F.

Referring to FIG. 4A, a conductive foil 20 is prepared, and a resist 21 is patterned on a surface of the conductive foil 20. As a material for the conductive foil 20, a metal including copper as a chief material, an alloy of Fe and Ni, or a material including Al as a chief material can be employed. The thickness of the conductive foil 20 changes depending on the thicknesses of the conductive patterns 18 to be formed. If the thickness of a second conductive pattern 18B is approximately several hundreds of micrometers, the conductive foil 20 having a thickness of not less than that thickness is employed. The resist 21 covers a portion in which the second conductive pattern 18B is to be formed.

Subsequently, referring to FIG. 4B, the front surface except a region where the resist 21 is formed is etched by wet etching using the resist 21 as an etching mask. With this etching, etched is the region without being covered with the resist 21 on the front surface of the conductive foil 20, thus forming a depressed portion 23, thus forming a depressed portion 23. Here, a region in which a first conductive pattern 18A is to be formed is formed to be thin enough to perform a fine patterning. Specifically, the thickness of the conductive foil 20 is reduced to approximately 9 µm to 80 µm. By this step, a portion covered with the resist 21 becomes a protruding portion 22 protruding in a convex shape. After this step is finished, the resist 21 is removed.

Referring to FIGS. 4C and 4D, a circuit substrate 16 provided with an insulating layer 17 on the surface thereof and the conductive foil 20 are brought into intimate contact with each other. Specifically, the conductive foil 20 is brought into intimate contact with the circuit substrate 16 so as to burying the protruding portion 22 in the insulating layer 17. If this contact is made with vacuum press, it is possible to prevent voids from being generated by air between the conductive foil 20 and the insulating layer 17. Moreover, side surfaces of the protruding portion 22 which are formed by isotropic etching are smooth curved surfaces. Accordingly, when the conductive foil 20 is pressed into the insulating layer 17, the resin enters along these curved surfaces, and thereby there is no unfilled portion. Thus, such side surface shapes of the protruding portion 22 also make it possible to suppress an occurrence of voids. In addition, since the protruding portion 22 is buried in the insulating layer 17, adhesion strength between the conductive foil 20 and the insulating layer 17 can be improved.

Moreover, since the upper surface (lower surface in FIG. 4B) of the conductive foil 20 of FIG. 4C is flat, the entire surface of the conductive foil 20 can be in contact with a contact surface of a pressure jig. Thus, the entire surface thereof can be equally pressed with a uniform force.

Next, referring to FIG. 4E, the conductive foil 20 bonded to the circuit substrate 16 is patterned. Specifically, the resist 21 is formed in a shape corresponding to the first and second conductive patterns to be formed, and then a patterning is performed by wet etching. Here, the resist 21, which covers a region corresponding to the second conductive pattern 18B on the conductive foil 20, is formed to be larger than the protruding portion 22. A purpose of this is to prevent the protruding portion 22 from being eroded by the etching of a next step. Furthermore, taking into consideration a mask misalignment when the resist 21 is formed, the above-described constitution makes it possible to surely separate the conductive patterns 18 by etching.

In this step, the thin first conductive pattern 18A and the thick second conductive pattern 18B are formed by partially removing the conductive foil 20 in a region except the protruding portion 22 by means of patterning. Accordingly, the conductive patterns 18 having different thicknesses can be formed at one time by patterning the thin portion of the conductive foil 20, the thickness of the thin portion being, for example, approximately 30 µm.

Referring to FIG. 4F, a description will be given of cross sections of the first and second conductive patterns 18A and 18B after the etching is performed with the resist 21. The conductive foil 20 in a region where the depressed portion 23 (see FIG. 4B) is formed is as thin as approximately several tens of micrometers in thickness. Accordingly, the first conductive pattern 18A can be finely formed. Here, the thin first conductive pattern 18A and the thick second conductive pattern 18B can be formed by performing the etching once.

The edge portion 18D is formed so as to two-dimensionally surround the protruding portion 22. In other words, the edge portion 18D is formed by forming the resist 21, which covers the upper portion of the protruding portion 22, to be larger than the protruding portion 22. Thus, when the second conductive pattern 18B is etched, a stable etching can be performed by forming the resist 21 to be larger. That is, since the wet etching is isotropic, side etching proceeds on the conductive patterns 18, and patterned side surfaces of the second conductive pattern 18B have tapered shapes. Accordingly, by performing the etching largely as described above, the second conductive pattern 18 can be prevented from being eroded by the side etching.

That is, if the protruding portion 22 is eroded, the cross-sectional area of the second conductive pattern 18B becomes small, a large current-carrying capacitance cannot be ensured, and also, the heat dissipation is reduced. Moreover, since the resist 21 is formed to have an error to a certain extent, the aforementioned constitution makes it possible to prevent the protruding portion 22 from being eroded due to this error.

Referring to FIGS. 5A to 5E, a second method of manufacturing the aforementioned hybrid integrated circuit device will be described. Here, the description will be given of a manufacturing method of forming a second conductive pattern 18B having the constitution shown in FIG. 3B. The method of forming the conductive patterns 18 here is basically the same as a forming method described with reference to FIGS. 4A to 4F, and therefore different points will be mainly described.

First, referring to FIGS. 5A to 5C, a conductive foil 20 is brought into intimate contact with an insulating layer 17 applied on a surface of a circuit substrate 16. Here, the conductive foil 20 is bounded by pressure bonding is performed while maintaining the thickness. Thereby, it is possible to suppress occurrence of "a wrinkle" of the conductive foil 20 in the pressure bonding step. After a region in which the thick second conductive pattern 18 is to be formed is covered with a resist 21, the surface of the conductive foil 20 is etched. By this etching, the conductive foil 20 in the region in which a thin first conductive pattern 18A is to be formed is made sufficiently thin. After this etching is finished, the resist 21 is removed.

Figure 5D:
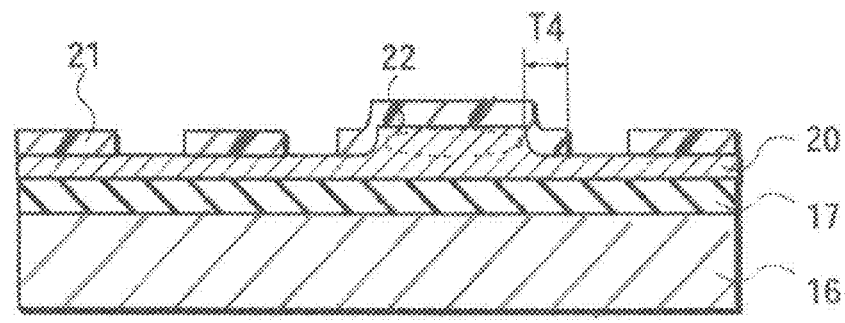
FIG. 5D is a cross-sectional view for explaining the hybrid integrated circuit device manufacturing method of the embodiment of the present invention.

Next, referring to FIG. 5D, a new resist 21 is applied on the surface of the conductive foil 20, and then the resist 21 is patterned so as to form the first and second conductive patterns. Also in this case, the resist 21 covering a protruding portion 22 covers an area larger than that of the protruding portion 22, so as to form an edge portion 18D as described above. That is, the resist 21 is applied so as to extend from the side surfaces of the protruding portion 22 to the thin portion.

Figure 5E:
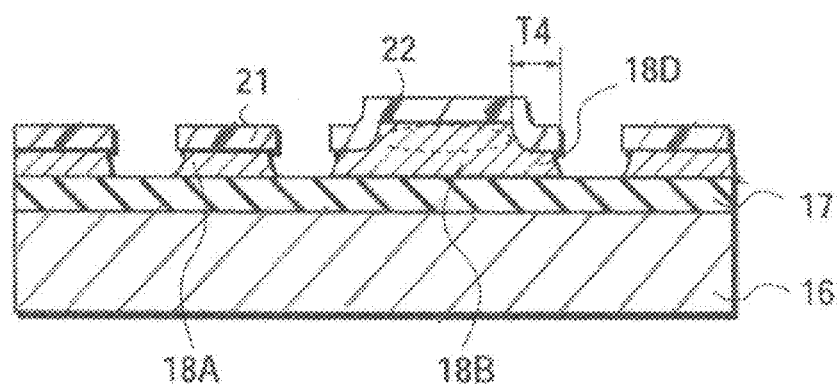
FIG. 5E is a cross-sectional view for explaining the hybrid integrated circuit device manufacturing method of the embodiment of the present invention.

Referring to FIG. 5E, subsequently, the first and second conductive patterns are formed by performing etching with the resist 21. Since the edge portion 18D is formed, a stable patterning can be performed without etching the protruding portion 22. After this etching is finished, the resist 21 is removed.

Referring to FIGS. 6A to 6F, a third method of manufacturing the hybrid integrated circuit device will be described. Here, the description will be given of a manufacturing method of forming the second conductive pattern 18B having the constitution shown in FIG. 3C. The method of forming the conductive patterns 18 here is also basically the same as the forming method described with reference to FIGS. 4A to 4F, and therefore, different points will be mainly described.

Referring to FIGS. 6A and 6B, a resist 21 is formed on a surface of a conductive foil 20 in which a second conductive pattern 18B is to be formed, and then, etching is performed. A protruding portion 22 is formed by this etching. The thickness of the conductive foil 20 in the region in which a depressed portion 23 is provided is thicker than that of a first conductive pattern 18A to be formed. Moreover, the pressure bonding is performed while the entire surface of the conductive foil 20 is in contact with the contact surface of the pressure jig. This makes it possible to suppress occurrence of "a wrinkle" of the conductive foil in the pressure bonding step.

Next, referring to FIGS. 6C and 6D, the surface of the region in which the protruding portion 22 is formed is covered with the resist 21. Then, the etching is performed. A purpose of the etching in this step is to form the protruding portions 22 respectively on both surfaces of the conductive foil 20 and to thin the conductive foil 20 in the region in which depressed portion 23 is provided. After this step is finished, the resist 21 is removed.

Figure 6E:
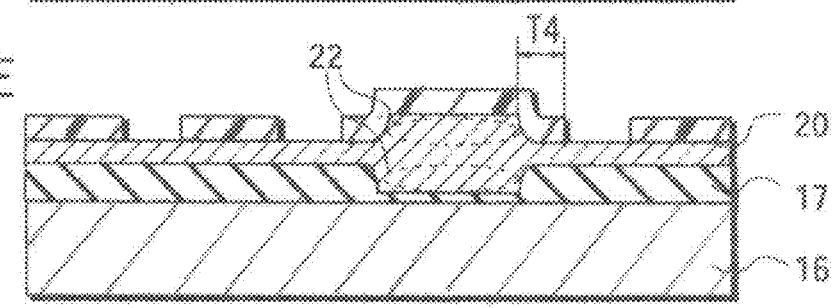
FIG. 6E is a cross-sectional view for explaining the hybrid integrated circuit device manufacturing method of the embodiment of the present invention.
Figure 6F:
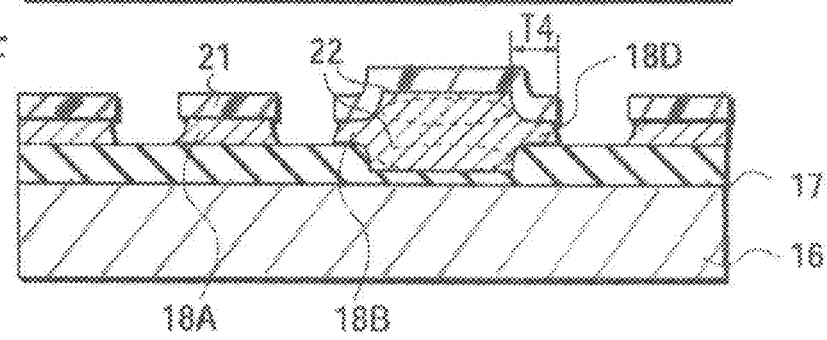
FIG. 6F is a cross-sectional view for explaining the hybrid integrated circuit device manufacturing method of the embodiment of the present invention.

Referring to FIGS. 6E and 6F, a new resist 21 is applied on the surface of the conductive foil 20, and then the resist 21 is patterned so as to form the first and second conductive patterns. Also in this case, the resist 21 covering the protruding portion 22 covers an area larger that that of the protruding portion 22. In this step, the second conductive pattern 18B is thickly formed by forming the protruding portions 22 on both surfaces of the conductive foil 20.

Referring to FIGS. 7A to 7E, a fourth method of manufacturing the hybrid integrated circuit device will be described. Here, the description will be given of another manufacturing method of form a second conductive pattern 18B having the constitution shown in FIG. 3C.

First, referring to FIGS. 7A and 7B, resists 21 are formed on a front surface and the back surface of a conductive foil 20 which correspond to a region in which the second conductive pattern 18B is to be formed. Then, protruding portions 22 are formed on the front surface and the back surface of the conductive foil 20 by etching on both of the surfaces. Accordingly, the protruding portions 22 can be formed on both of the surfaces of the conductive foil 20 by etching once.

Referring to FIGS. 7C to 7E, the conductive foil 20 is brought into intimate contact with a circuit substrate 16 in such a manner that one of the protruding portions 22 is buried into an insulating layer 17. Thereafter, the conductive foil 20 is patterned to form conductive patterns 18. This method is similar to that described with reference to FIGS. 6A to 6F, and therefore the description thereof is omitted here. The above is the description of the steps of patterning the conductive patterns 18. In hybrid integrated circuit substrates formed in the first to fourth manufacturing methods, circuit elements are placed at desired positions as shown in FIGS. 8A and 8B, and the circuit elements are electrically connected respectively to the conductive patterns 18.

First, referring to FIG. 8A, circuit elements 14 are fixed to conductive patterns (islands) 18 with solder, conductive paste or the like. Here, a first circuit element 14A which processes a small current is fixed to a first conductive pattern 18A. On the other hand, a second circuit element 14B, through which a large current flows, and which generates a large amount of heat, is fixed to a second conductive pattern 18B. Since a fine pattern can be realized in the first conductive pattern 18A, an element having a large number of terminals, such as an LSI, can be employed as the first circuit element 14A. Since the second conductive pattern 18B is formed to be thick sufficiently, a power transistor, an LSI or the like, which processes a large current, can be employed as the second circuit element 18B. Here, a plurality of units 24 constituting one hybrid integrated circuit device are formed on one piece of a circuit substrate 16, and die bonding thereof and wire bonding thereof can be collectively performed.

Referring to FIG. 8B, each of the circuit elements 14 and each of the conductive patterns 18 are electrically connected to each other through thin metal wires 15. In this embodiment, since a thick portion of the second conductive pattern 18B is buried in an insulating resin 17, the upper surfaces of the first and second conductive patterns 18A and 18B are on the same level. Accordingly, it becomes possible to use thin wires of approximately several tens of micrometers for an electrical connection of the second circuit element 14B. Conventionally, a deference of elevation has been large between a transistor mounted on an upper portion of a heat sink or the like and the conductive patterns 18. In some case, this difference of elevation is, for example, approximately 2 mm. Accordingly, firm thick wires have been used in order to prevent the wires from drooping due to their own weights and from causing a ship or a heat sink to short out. In this embodiment, since the upper surface of the second conductive pattern 18B corresponding to a heat sink is on a level equal to that of the first conductive pattern 18A, there is no need to use the firm thick wires. Here, the thin wires generally mean thin metal wires having diameters of approximately 80 μm.

After the above-described step is finished, the plurality of units 24 are divided into each unit 24. The division into each unit can be performed by punching with a pressing machine, dicing, bending or the like. Thereafter, leads 11 are fixed to the circuit substrate 16 of each unit.

Figure 9:
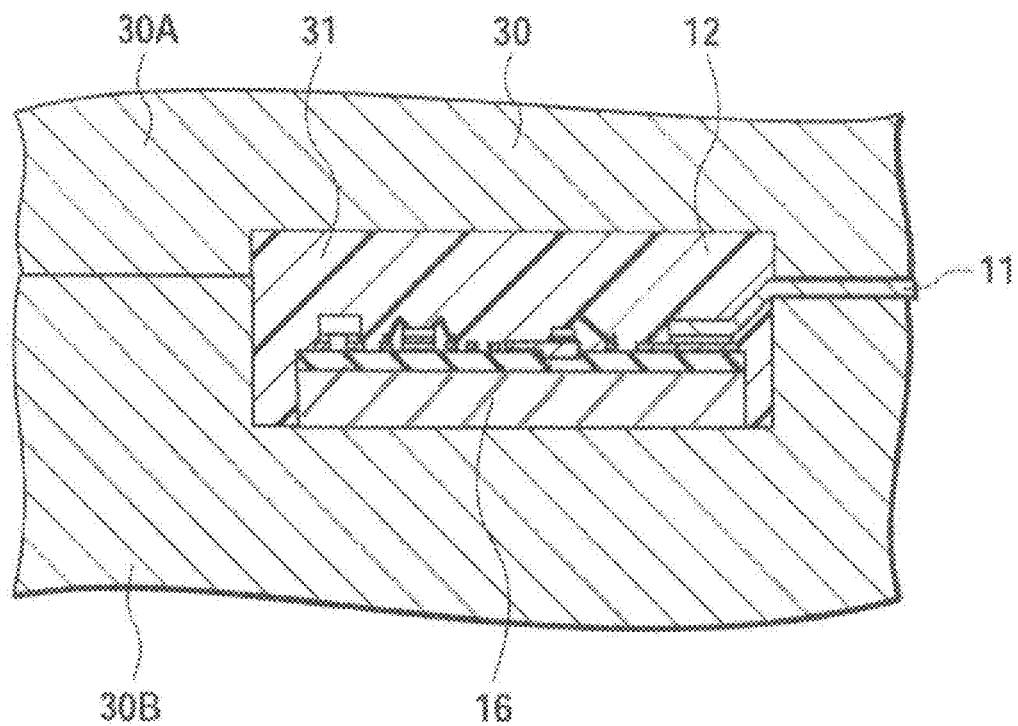
FIG. 9 is a cross-sectional view for explaining a hybrid integrated circuit device manufacturing method of the embodiment of the present invention.
Figure 10A:
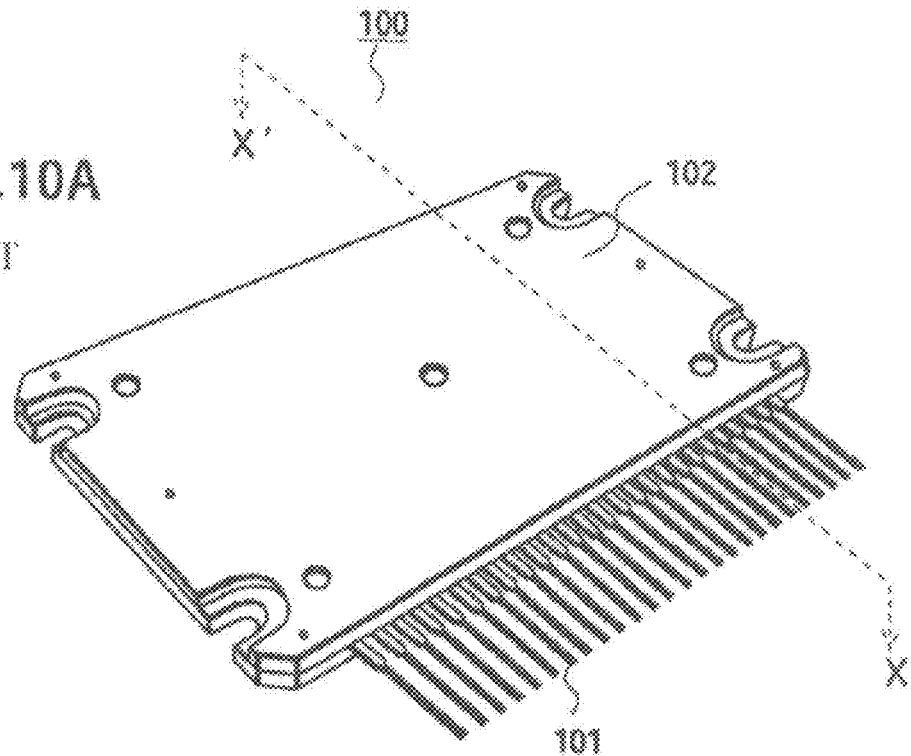
FIG. 10A is a perspective view for explaining a conventional hybrid integrated circuit device manufacturing method.
Figure 10B:
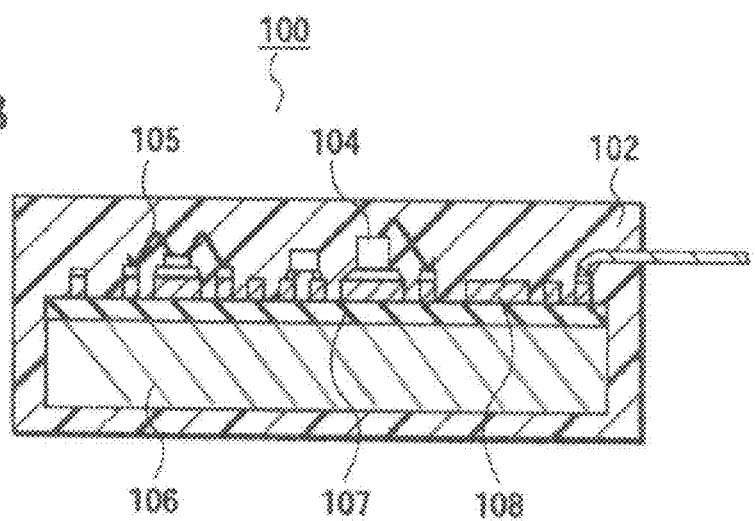
FIG. 10B is a perspective view for explaining the conventional hybrid integrated circuit device manufacturing method.

Referring to FIG. 9, each circuit substrate 16 is sealed with resin. Here, the sealing is performed by transfer molding using thermosetting resin. That is, after the circuit substrate 16 is contained in molds 30 including upper and lower molds 30A and 30B, the two molds are brought into intimate contact with each other, thus fixing the leads 11. Then, a resin sealing step is performed by injecting the resin into a cavity 31. By the above-described steps, the hybrid integrated circuit device as shown in FIGS. 1A and 1B is manufactured.

In the conventional hybrid integrated circuit substrates, all conductive patterns have been formed to have the same film thickness. Accordingly, in a portion through which a large current is required to flow, a pattern having a large width has been formed, or a heat sink has been additionally employed. However, in this application, a thick second pattern 18B and a thin first pattern 18A can be formed on the same hybrid integrated circuit substrate. Accordingly, heat dissipation and a current-carrying capacitance are ensured by the thick second conductive pattern 18B. In addition, providing the thin first conductive pattern 18A makes it possible to mount a small-signal component.

For example, in a case where a circuit substrate 16 made of A1 is used, heat dissipation can be improved by burying a protruding portion 22, which is formed in the second conductive pattern 18B, in an insulating layer 17 covering the surface of the substrate 16. This is because heat generated in a circuit element fixed to the second conductive pattern 18B is suitably conducted to the circuit substrate 16 through the protruding portion 22 buried in the insulating layer 17. If a filler is mixed in the insulating layer 17, the heat dissipation is further improved.

According to the embodiment of the present invention, it becomes possible to form conductive patterns having different thicknesses on a surface of one circuit substrate. Accordingly, a conductive pattern through which a large current-carrying capacitance is required to flow can be thickly formed, and a conductive pattern in a portion through which a relatively small current flows can be thinly formed. Furthermore, a wiring density can also be improved by adopting a fine conductive pattern. The above-described things make it possible to form, on one circuit substrate, conductive patterns following different pattern rules depending on the required current-carrying capacities.

Moreover, by fixing the second circuit element, through which a large current flows, to the second conductive pattern thickly formed, it becomes possible to actively release heat generated in the second circuit element to the outside. In particular, in a conductive pattern in which a portion of the back surface thereof is buried in an insulating layer as shown in FIGS. 4A to 4F, 6A to 6F, and 7A to 7E, the protruding portion of the back surface is covered with insulating resin. Accordingly, heat conduction through the insulating layer is improved.

What is claimed is:

1. A circuit device comprising:
   conductive patterns on a front surface of a circuit substrate;
   an insulating layer on the front surface of the circuit substrate; and
   circuit elements electrically connected to the conductive patterns,
   wherein the circuit substrate is metal,
   the insulating layer comprises a resin material,
   the conductive patterns are on the insulating layer and include a first conductive pattern and a second conductive pattern thicker than the first conductive pattern,
   back surfaces of the first and second conductive patterns are at substantially equal levels, a protruding portion is on a front surface of the second conductive pattern and integrally formed with the second conductive pattern in a single body, the protruding portion protruding, in a thickness direction, from the front surface of the second conductive pattern,
   the circuit elements comprise a power transistor mounted to the front surface of the second conductive pattern, and
   an edge portion of the second conductive pattern is formed around the protruding portion, the edge portion having a thickness substantially equal to that of the first conductive pattern and a width larger than the thickness of the first conductive pattern.

2. The circuit device according to claim 1, wherein the first conductive pattern is a pattern configured to pass small signals and the second conductive pattern is a pattern configured to pass large signals.

3. The circuit device according to claim 1, wherein the circuit substrate comprises Al or Cu.

4. The circuit device according to claim 1, wherein the insulating layer comprises a filler material.

* * * * *